(12) United States Patent
Schaffer et al.

(10) Patent No.: US 9,459,538 B2
(45) Date of Patent: Oct. 4, 2016

(54) LITHOGRAPHY APPARATUS AND METHOD FOR PRODUCING A MIRROR ARRANGEMENT

(71) Applicant: Carl Zeiss SMT GmbH, Oberkochen (DE)

(72) Inventors: Dirk Schaffer, Jena (DE); Wilfried Clauss, Ulm (DE); Hin-Yiu Anthony Chung, Ulm (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 14/534,644

(22) Filed: Nov. 6, 2014

(65) Prior Publication Data

US 2015/0055112 A1    Feb. 26, 2015

Related U.S. Application Data

(63) Continuation of application No. PCT/EP2013/061096, filed on May 29, 2013.

(60) Provisional application No. 61/654,179, filed on Jun. 1, 2012.

(30) Foreign Application Priority Data

Jun. 1, 2012   (DE) .................. 10 2012 209 309

(51) Int. Cl.
*G03B 27/54*   (2006.01)
*G03B 27/42*   (2006.01)
(Continued)

(52) U.S. Cl.
CPC ............ *G03F 7/702* (2013.01); *G02B 5/0891* (2013.01); *G02B 7/182* (2013.01); *G03F 7/70825* (2013.01)

(58) Field of Classification Search
CPC ........................................................ G03F 7/702
USPC ................. 355/52, 53, 67; 358/819–822; 359/819–822
See application file for complete search history.

(56) References Cited

U.S. PATENT DOCUMENTS 6,870,632 B2 *  3/2005  Petasch .................. G02B 7/023
                                                          356/614
6,880,942 B2    4/2005  Hazelton et al.
(Continued)

FOREIGN PATENT DOCUMENTS

JP       2002350699 A    12/2002
WO    WO 2005/106557    11/2005
WO    WO 2011/039103     4/2011

OTHER PUBLICATIONS

International Search Report and Written Opinion for corresponding PCT APpl No. PCT/EP2013/061096, dated Sep. 26, 2013.
(Continued)

*Primary Examiner* — Hung Henry Nguyen
(74) *Attorney, Agent, or Firm* — Fish & Richardson P.C.

(57) ABSTRACT

A lithography apparatus is disclosed, having at least one mirror arrangement which includes a mirror substrate including a front side with a reflecting surface, a side wall, which extends along a circumference of the mirror substrate from a rear side of the mirror substrate, and mounting elements to mount the mirror arrangement on a structural element of the lithography apparatus. The rear side of the mirror substrate and an inner side of the side wall delimit a cavity. Each of the mounting elements is connected to the mirror arrangement at a connection surface. The relation S/D>0.5 is satisfied at least one of the connection surfaces, wherein D denotes a thickness of the side wall at the connection surface and S denotes the length of the shortest path through the mirror material from the centroid of the connection surface to the rear side of the mirror substrate.

26 Claims, 8 Drawing Sheets

(51) Int. Cl.
*G02B 7/02* (2006.01)
*G03F 7/20* (2006.01)
*G02B 5/08* (2006.01)
*G02B 7/182* (2006.01)

(56) References Cited

U.S. PATENT DOCUMENTS

2002/0176094 A1  11/2002  Petasch et al.

2006/0245035 A1* 11/2006 Uchida ............... G03F 7/70266
                                                           359/291

OTHER PUBLICATIONS

Japanese Office Action, with translation thereof, for JP Appl No. 2015-514491, dated Sep. 29, 2015.

Korean Notice of Preliminary Rejection, with translation thereof, for KR Appl No. 10-2014-7033166, dated Feb. 22, 2016.

* cited by examiner

LITHOGRAPHY APPARATUS AND METHOD FOR PRODUCING A MIRROR ARRANGEMENT

CROSS-REFERENCE TO RELATED APPLICATIONS

The present application is a continuation of, and claims benefit under 35 USC 120 to, international application PCT/EP2013/061096, filed May 29, 2013, which claims benefit under 35 USC 119 of the German patent application DE 10 2012 209 309.5, filed Jun. 1, 2012 and U.S. patent application 61/654,179, filed Jun. 1, 2012. The whole description of each of these applications is incorporated herein by reference.

FIELD OF THE INVENTION

The invention relates to a lithography apparatus with one or more mirror arrangements, and a method for producing a mirror arrangement for such a lithography apparatus.

RELATED ART

By way of example, lithography apparatuses are used in the production of integrated circuits (ICs) in order to image a mask pattern in a mask onto a substrate such as e.g. a silicon wafer. Here, a light beam generated by an illumination device is directed onto the substrate through the mask. An exposure lens, which consists of several optical elements, serves to focus the light beam on the substrate. Examples of such lithography apparatuses are, in particular, EUV (extreme ultraviolet) lithography apparatuses, which operate with optical wavelengths for the exposure in the range between 5 nm and 30 nm. Such short wavelengths enable the imaging of very small structures on the wafer. Since light in this wavelength range is absorbed by atmospheric gases, the beam path of such EUV lithography apparatuses is situated in a high vacuum. Furthermore, there is no material which is sufficiently transparent in the aforementioned wavelength range, which is why mirrors are used as optical elements for shaping and guiding the EUV radiation.

Figure 1:
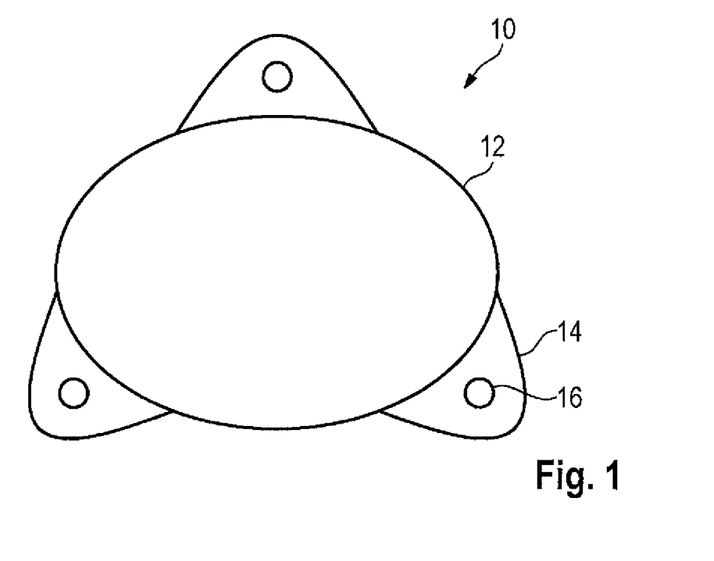
FIG. 1 is a schematic illustration of a conventional mirror arrangement.

EUV lithography apparatuses with a high numerical aperture require mirrors with large diameters. Mirrors with large diameters are, on the one hand, costly in production and, on the other hand, make low-deformation mounting and actuation more difficult. In order to achieve low-deformation mounting and actuation, use can be made of mirrors which comprise several mounting sections, which are situated outside of the mirror surface but in the same plane as the mirror surface. As an example, FIG. 1 shows a rear view of such a mirror arrangement. The mirror arrangement 10 illustrated in FIG. 1 comprises an oval mirror substrate 12, the front side of which is provided with a reflecting surface.

Bulges 14 (so-called "ears") are provided at three locations on the circumferential edge of the mirror substrate 12. These bulges 14 are provided in an integral fashion with the mirror substrate 12. A mounting element 16 is respectively provided on the rear or front side of each of the three bulges 14. The mirror is mounted on a frame of the lithography apparatus via these three mounting elements 16. Actuators can be provided between the mounting elements 16 and the frame, via which actuators the position and the orientation of the mirror can be adjusted.

In the mirror arrangement in FIG. 1, the mirror is connected to the mounting elements 16 outside of the mirror substrate 12 and spaced apart from these by a certain distance. The connection surfaces, i.e. the joining surfaces, between the mounting elements 16 and the bulges 14 of the mirror arrangement 10 are oriented in such a way that the normals thereof point approximately in the direction of the mirror axis or the light ray directed to the mirror. An advantage of this is that, when connecting the mounting elements 16 to the mirror arrangement, deformations or joining effects occurring in the direction of the normal do not have a direct effect on the mirror substrate 12 and the reflecting surface provided thereon. Hence, joining effects are decoupled from deformations. Likewise, mounting forces do not act directly on the mirror substrate 12.

A disadvantage in the arrangement shown in FIG. 1 is that the bulges, which are situated far away from the center of gravity of the mirror arrangement 10, have a negative influence on the rigidity of the mirror arrangement as a result of an inexpedient mass distribution. Moreover, the bulges 14 contribute to the overall mass of the mirror arrangement 10 such that the latter becomes heavier overall, which is likewise disadvantageous for the actuability and mirror dynamics. Finally, the provision of the bulges 14 leads to a larger overall diameter of the mirror arrangement 10.

U.S. Pat. No. 6,880,942 B2 (see FIG. 3A therein) discloses an optical element with a relatively thin mirror body 310, which is already deformed by comparatively small forces. A relatively thick substrate body 320 is arranged behind this mirror body. Inflatable bladders 330 for actuating the mirror body are arranged between the mirror body and the substrate body. It remains unclear in this case how the optical element is mounted on a frame structure or the like of the lithography apparatus.

US patent application US 2002/0176094 A1 discloses a device for mounting an optical element in an optical unit, more particularly a mirror or a lens, in a projection exposure apparatus, more particularly a projection lens in semiconductor lithography, with at least three articulation sites arranged on the circumference of the optical elements, on which articulation sites respectively one mounting apparatus engages, which is joined to an outer base structure on the side facing away from the articulation site, wherein the mounting apparatus comprises at least one leaf spring-like bending member, arranged tangentially with respect to the optical element, and at least one leaf spring-like bending member arranged in the radial direction with respect to the optical element.

In view of the above-described situation, it is therefore an object of the present invention to provide a lithography apparatus with a mirror arrangement, via which at least one of the aforementioned problems is solved, and also a method for the production of such a mirror arrangement. In particular, it is an object of the present invention to develop a lithography apparatus with a mirror arrangement, which provides better deformation decoupling whilst having a lower weight.

SUMMARY OF THE INVENTION

In accordance with one aspect of the invention, this object may be achieved by a lithography apparatus having at least one mirror arrangement, which comprises a mirror substrate, the front side of which is provided with a reflecting surface, and a side wall, which extends along a circumference of the mirror substrate from a rear side of the mirror substrate, wherein the mirror substrate and the side wall delimit a cavity. The mirror arrangement is mounted on a structural element of the lithography apparatus via a plurality of mounting elements, each of the mounting elements being connected (or attached) to the mirror arrangement at a connection surface, and wherein the relation S/D>0.5 is satisfied at at least one of the connection surfaces, wherein D denotes a thickness of the side wall at the connection surface and S denotes the difference (T−M) between the length of the shortest path T through the mirror material from the centroid of the connection surface to the front side of the mirror substrate and a thickness M of the mirror substrate. If the thickness M of the mirror substrate is constant along its surface, then S is the length of the shortest path through the mirror material from the centroid of the connection surface to the rear side of the mirror substrate. The relation S/D>1 is satisfied in a possible embodiment. In a further possible embodiment, the relation S/A>1 is satisfied, where A denotes the extent of the connection surface on the side wall, in particular in the direction of the optical axis of the mirror arrangement. In a further possible embodiment, the relation S/A>1.5 is satisfied. Using one or more the aforementioned relations, it is possible to reduce the spread of stress, introduced into the side wall at the connection surface, up to the mirror surface.

Since a cavity is provided on the rear side of the mirror substrate, the weight of the mirror arrangement can be decisively reduced. At the same time, the side wall, which extends along the circumference, can ensure a sufficient rigidity of the mirror arrangement in the case of a large mirror diameter. The side wall can be provided along the whole circumference of the mirror arrangement. The rigidity of the mirror arrangement can be set in a simple fashion by the thickness of the side wall. Here, the "front side" denotes the side of the mirror arrangement on which the light to be guided by the mirror arrangement impinges and "rear side" denotes the side facing away from the front side.

The "connection surfaces" denote the regions of the surface of the mirror arrangement at which the mounting elements are connected (i.e. attached) to the mirror arrangement.

In this case, "along a circumference of the mirror substrate" can mean that the side wall is arranged directly on one edge of the mirror substrate, that is to say e.g. arranged flush with the edge of the mirror substrate. However, "along a circumference of the mirror substrate" can also mean that the side wall is arranged at a distance from the edge of the mirror substrate. The distance between the side wall and the edge can be constant, i.e. the side wall can extend parallel to the edge of the mirror substrate. However, it is also possible for the distance between the side wall and the edge to vary along the circumference. Moreover, the side wall may form a closed loop, but it can also be segmented or provided with local breakthroughs. Furthermore, the thickness of the side wall can be constant along the circumference; however, it is also possible for the thickness of the side wall to vary along the circumference.

In accordance with a further aspect of the invention, a lithography apparatus is provided that includes at least one mirror arrangement, the mirror arrangement comprising a mirror substrate, the front side of which is provided at least in part with a reflecting surface, and a side wall, which extends along a circumference of the mirror substrate from a rear side of the mirror substrate, wherein the mirror substrate and the side wall delimit a cavity. The mirror arrangement is mounted on a structural element of the lithography apparatus via a plurality of mounting elements, each of the mounting elements being connected (or attached) to the mirror arrangement at a connection surface, and wherein normals on the respective connection surfaces extend through the cavity. In particular, a normal on the centroid of the connection surface may extend through the cavity.

Here, "normals" denote the surface normals, i.e. virtual straight lines which are perpendicular to the connection surfaces. Radially inward (i.e. in the direction toward the center of the mirror), the normals initially extend through the cavity before they may once again impinge on the side wall or on the mirror substrate. This means that mounting and actuation forces and the like do not act on the mirror substrate in this direction, but rather that the flow of forces is deflected through the side wall. This achieves a decoupling of deformation forces. This is particularly the case if all surface normals on the connection surfaces extend through the cavity at least in sections. The structural element can, for example, be a frame, e.g. a frame which deflects forces of the lithography apparatus.

The connection surfaces of the mounting elements can, for example, be respectively arranged on the outer side of the side wall. Furthermore, the cavity can be open toward one side, e.g. to the rear side. Such a cavity is also referred to as a "recess" in the following text. If the cavity is open toward one side, a further reduction in weight can be achieved.

However, it is also possible for the cavity to be closed toward all sides. By way of example, it is possible for the mirror arrangement furthermore to comprise a cover element, which is joined to the top side of the side wall in such a way that the rear side of the mirror substrate, the side wall and the cover element delimit the cavity. This allows the rigidity of the mirror arrangement to be increased. Such a cover element can be provided integrally (i.e. monolithically) with the mirror body made of mirror substrate and side wall, or as a separate element connected thereto.

The weight of the mirror arrangement can be reduced further by providing an opening in the cover element. Furthermore, the mirror rigidity can be adjusted via the size of this opening. An internal diameter of the opening can be less than half of the diameter of the mirror substrate.

If the extent A of the connection surface along the side wall, e.g. in the direction of the optical axis of the mirror arrangement, is small, that is to say e.g. less than the depth B of the cavity, the deformations of the connection are, firstly, kept small and, secondly, an expedient deformation decoupling is achieved.

An elevation can be provided at a distance from the edge of the rear side of the mirror substrate in such a way that an annular groove is formed between the inner side of the side wall and the elevation. Such an elevation C likewise increases the rigidity of the mirror body whilst maintaining the deformation decoupling. The maximum height of the elevation can, for example, be 0.1 to 0.8 times the depth B of the cavity.

The extent A of the connection surface in the direction of the optical axis of the mirror arrangement, the height C of the elevation and the thickness D of the side wall can be substantially equal. Here, "substantially equal" means that the maximum deviation between these lengths is no more than 20%, preferably no more than 5%, of the longest of these three lengths.

A method according to the invention for producing a mirror arrangement for a lithography apparatus comprises the following steps:

attaching mounting elements on a flat side of a disk-shaped cover element;

adapting the shape of an attachment region of the cover element to the shape of an attachment region of a side wall, which extends along a circumference of a mirror substrate from a rear side of the mirror substrate, the front side of which is provided with a reflecting surface; and attaching the cover element in such a way that the mirror substrate, the side wall and the cover element delimit a cavity.

In accordance with this production method, the mounting elements are initially attached to the cover elements, and only then is the shape of the cover element adapted to the shape of the annular side wall to which the cover element is attached. Deformations possibly occurring during the attachment of the mounting elements to the cover element can therefore still be compensated for before attaching the cover element to the mirror body such that these do not influence the geometry of the mirror surface and a mirror arrangement with even more precise dimensions can be obtained.

In the process, it is possible initially to detect the deformations on the attachment region of the cover element, which were created as a result of attaching the mounting elements, and then to process the attachment region of the cover element in such a way that the detected deformations are corrected. The attachment region of the cover element can be an annular edge region of the cover element, which is attached to the side wall. The detected deformations can be compensated for by polishing or the like.

Further exemplary embodiments will be explained with reference to the attached drawings.

If nothing else is specified, the same reference signs in the figures denote the same or functionally equivalent elements. Furthermore, it should be noted that the illustrations in the figures are not necessarily drawn to scale.

BEST MODE FOR CARRYING OUT THE INVENTION

Figure 2:
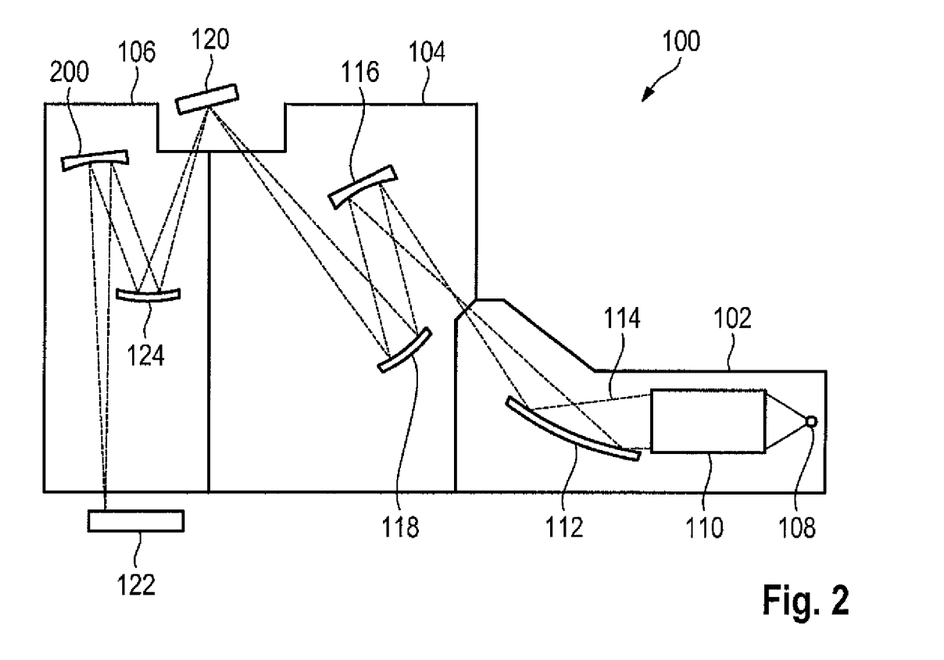
FIG. 2 shows a schematic view of an EUV lithography apparatus in accordance with one embodiment.

FIG. 2 shows a schematic view of an EUV lithography apparatus 100 in accordance with one embodiment, which comprises a beam shaping system 102, an illumination system 104 and a projection system 106. The beam shaping system 102, the illumination system 104 and the projection system 106 are respectively provided in a vacuum housing, which is evacuated with the aid of an evacuation device (not illustrated in any more detail). The vacuum housing is surrounded by a machine room (not illustrated in any more detail), in which the drive devices for mechanical displacement or adjustment of the optical elements are provided. Furthermore, electric controls and the like can also be provided in this machine room.

The beam shaping system 102 has an EUV light source 108, a collimator 110 and a monochromator 112. By way of example, a plasma source or a synchrotron, which emit radiation in the EUV range (extreme ultraviolet range), that is to say e.g. in the wavelength range between 5 nm and 20 nm, can be provided as EUV light source 108. The radiation emitted by the EUV light source 108 is initially focused by the collimator 110, after which the desired operating wavelength is filtered out via the monochromator 112. Hence the beam shaping system 102 adapts the wavelength and the spatial distribution of the light emitted by the EUV light source 108. The EUV radiation 114 created by the EUV light source 108 has a relatively low transmittance through air, which is why the beam guiding spaces in the beam shaping system 102, in the illumination system 104 and in the projection system 106 are evacuated.

In the illustrated example, the illumination system 104 comprises a first mirror 116 and a second mirror 118. By way of example, these mirrors 116, 118 can be designed as facet mirrors for pupil shaping and guide the EUV radiation 114 onto a photomask 120.

The photomask 120 is likewise embodied as a reflective optical element and can be arranged outside of the systems 102, 104, 106. The photomask 120 has a structure, which is imaged in a reduced manner on a wafer 122 or the like via the projection system 106. To this end, the projection system for example comprises a third mirror 124 and a fourth mirror 200 in the beam guiding space 106. It should be noted that the number of mirrors of the EUV lithography apparatus 100 is not restricted to the illustrated number, and that also more or fewer mirrors may be provided. Moreover, the mirrors are generally curved on their front sides for beam shaping purposes.

Figure 3:
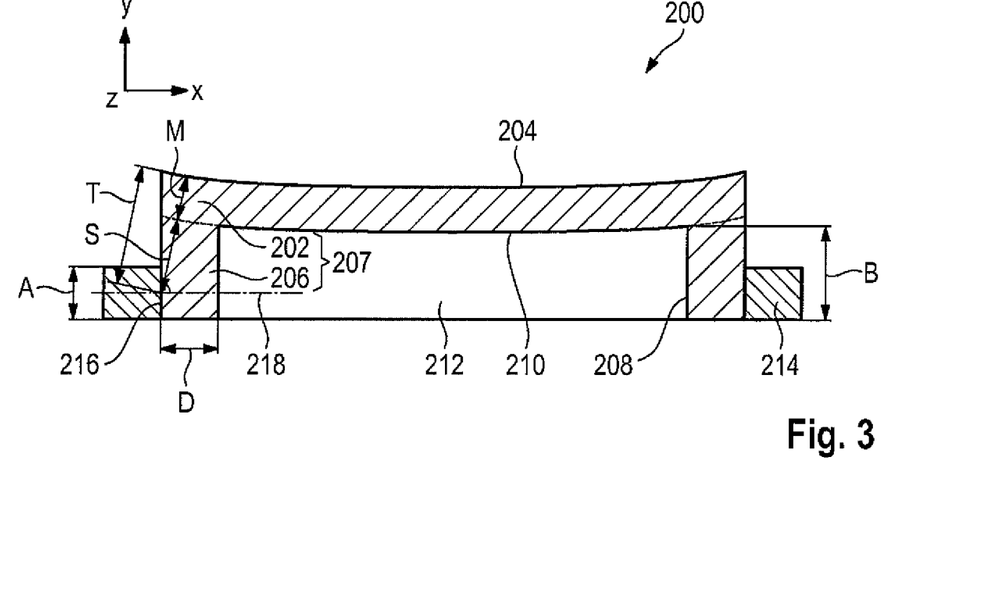
FIG. 3 is a schematic illustration of a mirror arrangement in accordance with one embodiment.

FIG. 3 is a schematic illustration of a mirror arrangement 200 in accordance with one embodiment. In this embodiment, the mirror arrangement 200 comprises a mirror substrate 202, which can, for example, have a circular, oval, elliptic or kidney-shaped embodiment in the top view. Materials whose coefficient of thermal expansion is close to zero at the operating temperature are suitable as material for the mirror substrate 202. Such materials are also referred to as "zero-expansion materials". Examples of such materials are glass ceramic materials, quartz glass doped with titanium or else cordierite provided with suitable additives.

On the front side of the mirror substrate 202, i.e. on the side facing the beam path, a reflecting coating 204 which is suitable for reflecting light in the EUV range is provided.

On the rear side of the mirror substrate 202, an annular side wall 206 is provided (e.g. by a suitable undercut). The side wall 206 is formed integrally with the mirror substrate 202 and therefore consists of the same material. The side wall 206 may be provided along the whole circumference of the mirror arrangement 200. In the present embodiment, the annular side wall 206 is arranged directly on the circumference of the mirror substrate 202, i.e. flush with the lateral edge of the mirror substrate 202. Here, "annular" does not necessarily mean the shape of a circle or rotationally symmetric, but can also, for example matching the shape or the cross section of the mirror, denote an oval, elliptical or kidney-shaped closed loop or the like. A closed loop is expedient in respect of the rigidity of the mirror body 207. Together, the side wall 206 and the mirror substrate 202 form a mirror body 207. The inner side 208 (or the inner circumferential surface) of the side wall 206 and the rear side 210 (or the rearward-facing surface) of the mirror substrate delimit a cavity 212. The cavity 212 is delimited in five spatial directions, namely in the x, −x, z, −z and y directions, and is only open in one spatial direction, namely the −y direction. The cavity 212 therefore forms a recess in this embodiment.

The mirror arrangement 200 is mounted on a structural element (not illustrated in any more detail) of the lithography apparatus 100 via a plurality of mounting elements 214. By way of example, the mirror arrangement can be mounted on a frame of the lithography apparatus 100 which diverts forces. This mounting can be active or passive, and the mounting elements 214 can be mounted on the frame of the lithography apparatus 100 via further coupling elements. In the case of active mounting, the distal ends of the mounting elements 214 can be respectively attached to one side of an actuator, whereas the other side of the actuator is attached to the frame. This enables an adjustment of the position and the orientation of the mirror arrangement 200. In the case of passive mounting, the distal ends of the mounting elements 214 can be respectively attached to one side of a damping element, such as e.g. a spring element, whereas the other side of the spring element is attached to the frame. This enables damping of the transmission of vibrations and the like onto the mirror arrangement 200. A combination of active and passive mounting is also possible.

By way of example, the mounting elements 214 can be substantially cylindrical, wherein one of the flat sides of the cylindrical shape is respectively connected to the outer or inner side of the side wall 206. The joining surfaces between the mounting elements 214 and the side wall 206 are also referred to as connection surfaces 216 in the following text. The connection surfaces can be planar or curved, i.e. for example following the curvature of the side wall 206. The mounting elements 214 can be hollow cylinders, contributing to a further reduction in the overall weight. However, they can also be embodied as solid cylinders. If the mounting elements 214 are hollow cylinders at least in sections, that is to say e.g. being a hollow cylinder at least in the region of the connection to the side wall 206, the connection surface 216 can be reduced, enabling a reduction in the local stresses due the connection. The mounting elements 214 can be made of a different material than the mirror substrate 202 and the side wall 206. By way of example, they can be made of a metal with a low coefficient of thermal expansion, such as e.g. invar (an iron-nickel alloy). The mounting elements 214 can be connected to the side wall 206 via a cohesive joint, i.e. via a joint in which the mounting elements 214 and the side wall 206 are held together by atomic or molecular forces and which can only be separated by destroying the joining mechanism. By way of example, the mounting elements 214 can be adhesively bonded or soldered onto the side wall 206.

Well-balanced mounting in the case of a comparatively low weight emerges if three mounting elements 214 are connected at three suitable points of the circumference of the side wall 206. However, it is also possible to provide four or more mounting elements 214.

In general, the arrangement described here can be applied to mirrors of all sizes; however, the effect of deformation decoupling, described further below, is particularly advantageous in the case of mirrors with large diameters, i.e. in the case of mirrors whose maximum diameter is e.g. greater than 30 cm or greater than 40 cm and can be up to 100 cm or more. The lateral extent A of the mounting elements 214 (in FIG. 3 this is the height or the extent in the direction of the mirror axis) can, for example, be 1 to 15 cm, depending on the size of the mirror. The maximum depth B of the cavity is at the inner side of the side wall 206. The overall height of the mirror arrangement can, for example, be 3 to 40 cm, depending on the size of the mirror. Accordingly, the maximum depth B can, for example, be 1.5 to 38 cm. By way of example, the thickness D of the side wall 206 can be 1 to 15 cm.

The mirror arrangement illustrated here is particularly well-suited to large mirror geometries because the overall weight of the mirror arrangement 202 can be significantly reduced on account of the cavity 212. Furthermore, the overall diameter can be reduced compared to conventional mirror arrangements since there is no need for the provision of bulges or ears and hence the connection surfaces 216 can be arranged closer to the reflecting surface 204 of the mirror arrangement 200. At the same time, the annular side wall 206 has a stiffening effect, and so a comparatively high rigidity of the mirror arrangement 200 can be obtained, even in the case of a relatively low weight.

Furthermore, an extensive deformation decoupling is achieved by connecting the mounting elements 214 to the outer side of the side wall 206. Local stresses can occur for example on the connection surfaces between the mounting elements 214 and the side wall 206. By way of example, these stresses can occur during the production, for example if the adhesive, via which the mounting elements 214 are adhesively bonded to the side wall 206, shrinks. Since the mounting elements 214 are not provided level with the mirror substrate 202, but are connected to the side wall 206 adjoining therebehind, the forces occurring on account of such local stresses are not directly transmitted onto the mirror substrate and the reflecting surface provided thereon either. Rather, the side wall 206 has a certain amount of elasticity, as a result of which deformation decoupling can be achieved. Furthermore, this arrangement also achieves low-deformation mounting or actuation since forces occurring during the mounting or during the actuation are largely decoupled from the mirror substrate 202 by the connection of the mounting elements 214 to the side wall 206.

Here, the depth B of the cavity 212 at the side wall 206 is greater than the height A of the mounting elements 214, i.e. B>A. Furthermore, the connection surfaces at which the mounting elements 214 are joined to the side wall 206 are situated behind the mirror substrate 202 in relation to the incident light. In other words, a normal 218 arranged at any point on the connection surfaces 216 extends at least in sections through the cavity 212 before it once again enters the opposite side wall 206. The following also applies to the exemplary embodiment illustrated in FIG. 3: a normal arranged at any point on the connection surfaces 216 does not intersect the mirror substrate 202 but only the side wall 206.

The deformation decoupling increases with the ratio B/D of the depth B of the cavity 212 at the side wall 206 to the thickness D of the side wall. By way of example, good deformation decoupling can be obtained in the case of a ratio B/D>1, advantageously B/D>1.5, more advantageously B/D>2.

In general terms, an advantageous deformation decoupling can be achieved if the connection surfaces 216 of the mounting elements 214 are arranged in such a way that the spread of stress, originating therefrom, has decayed to a certain extent before it reaches the mirror substrate 202. A measure for the distance between the mirror substrate 202 and the (mean) location of the introduction of stress at the connection surface 216 is the measure S, which corresponds to the difference (T−M) between the length of the shortest path T through the mirror material from the centroid of the connection surface 216 to the front side of the mirror substrate 202 and a thickness M of the mirror substrate 202, i.e. S=T−M, cf. FIG. 3.

An advantageous decay of the stresses introduced at the connection surface 216 and hence a substantial reduction in the surface deformation on the surface 204 of the mirror substrate is achieved if this measure S is greater than half the thickness of the side wall, i.e. if S/D>0.5 is satisfied. Even better deformation decouplings can be achieved, the greater this ratio S/D is, that is to say for example at S/D>0.8, S/D>1.0 or S/D>1.5. In the example illustrated in FIG. 3, S/D≈1.3 applies.

If the mounting elements 214 are cylindrical, the connection surfaces 216 are substantially circular, and the centroid of the connection surfaces 216 lies in the center of the circular cylinder cross section. If the mounting elements 214 are hollow cylinders, the centroid lies within the annular connection surfaces. It should furthermore be noted that the connection surfaces 216 are not necessarily planar, i.e. lie in a plane, but rather can be curved along the annular side wall 206. In this case, the center of gravity of the projection of this three-dimensional curved surface in a suitable plane, e.g. the yz-plane in FIG. 3 tangential to the side wall 206, can be assumed to be the centroid of the connection surface 216.

The rear side 210 of the mirror substrate 202 delimits the cavity 212 on the inner side of the side wall 206. From there, the rear side 210 continues to the outer side of the mirror 200, which is indicated by dashed lines in FIG. 3. Hence, the rear side 210 of the mirror substrate has two sections: namely an inner section (illustrated as a full line), which forms the interface between the mirror substrate 202 and the cavity 212, and an outer, annular section (illustrated as a dashed line) which forms the interface between the mirror substrate 202 and the side wall 206. This outer, annular section possibly continues the curvature of the first section. If the mirror substrate 202 has a constant thickness M along its surface, then S corresponds to the length of the shortest path through the mirror material from the centroid of the connection surface 216 to the rear side of the mirror substrate 202.

If the thickness M of the mirror substrate 202 varies along its surface, then the minimum thickness of the mirror substrate 202 can be taken as the thickness M. By way of example, the thickness of the mirror substrate 202 may reduce toward the center thereof in order to compensate for gravitational effects. In this case, the thickness in the center of the mirror substrate 202 is taken as the thickness M. A similar statement applies to the thickness D of the side wall 206: if the thickness of the side wall 206 varies on the connection surface 216, then the minimum thickness of the side wall 206 at the connection surface 216 can be taken as the thickness D. In other words, the relation S/D>0.5 may be satisfied, where D denotes the minimum thickness of the side wall 206 at the connection surface 216 and S denotes the difference (T−M) between the length of the shortest path T through the mirror material from the centroid of the connection surface 216 to the front side of the mirror substrate 202 and the minimum thickness M of the mirror substrate 202.

As already mentioned above, it is necessary for the deformation decoupling that B>A applies, i.e. that the depth B of the cavity 212 is greater than the height A of the mounting elements 214. However, if the height A is approximately equal to the depth B, i.e. if A≈B, then the mounting elements 214 can extend over almost the whole side wall 206 up to the vicinity of the rear side of the mirror substrate 202, and so introduction of stress from the mounting elements 214 can continue to the front side of the mirror substrate 202. It is for this reason that the depth B of the cavity 212 may be made to be at least twice as large (B>2A) or three times as large (B>3A) as the height A of the mounting elements 214.

Furthermore, the introduction of stress from the mounting elements 214 into the side wall 206 should occur at a certain minimum distance from the rear side 210 of the mirror substrate 202. In order to ensure this, S/A>1 may be satisfied, i.e. for the above-described measure S to be greater than the height A of the mounting elements 214. The spread of stress largely decays in the lateral direction after a distance A. It follows that it also largely decays within a distance A in the direction perpendicular thereto. Even better deformation decoupling can be achieved by S/A>1.3 or S/A>1.5.

The aforementioned conditions for S/D and S/A are defined purely on the basis of the geometric dimensions of the mirror elements and the actual introduction of stress was ignored. However, depending on the orientation of the mirror arrangement 200, the introduction of stress at the upper end of the connection surface 216 can, for example, be greater or less than that at the lower end. In order to take this into account, the point of maximum introduction of stress or else the "center of gravity" of the introduction of stress (e.g. determined by weighting the connection surface with the locally acting stress vectors or the absolute values thereof) can be selected as the end point of the paths S and T instead of the centroid. However, it should be noted that the introduction of stress may also depend on the operation state.

Figure 4:
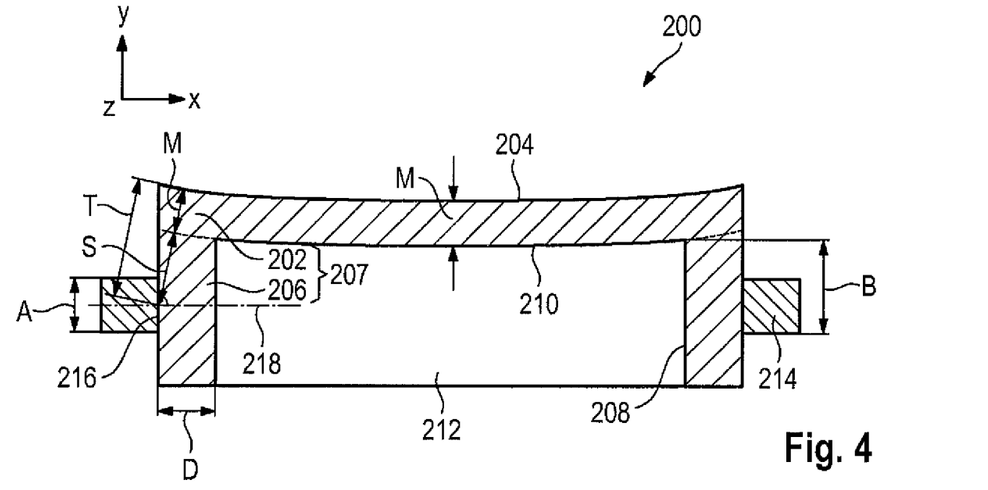
FIG. 4 is a schematic illustration of a mirror arrangement in accordance with a further embodiment.

FIG. 4 is a schematic illustration of a mirror arrangement 200 in accordance with a further embodiment. Provided that nothing else is specified, the elements in FIG. 4, which are the same as or functionally equivalent to elements in FIG. 3, are denoted by the same reference signs, and will not be explained in any more detail. The same also applies to the following embodiments and figures.

The mirror arrangement 200 shown in FIG. 4 differs from the mirror arrangement 200 in FIG. 3 by virtue of the fact that the side wall 206 is slightly higher and the mounting elements 214 are not arranged flush with the edge of the side wall 206, but rather are arranged substantially centrally on the side wall 206. The conditions S/D>0.5 and S/A>1 are also satisfied in this arrangement, and so good deformation decoupling is provided. Here S=T−M also applies, just like in the exemplary embodiments described in the following text. Furthermore, in the mirror arrangement 200 in FIG. 4, the normals on the connection surfaces 216 extend through the cavity 212, which, as explained above, contributes to the deformation decoupling. Moreover, the mirror body 207 has overall greater mirror rigidity as a result of the elongated side wall 206. By contrast, the mirror arrangement 200 in FIG. 3 is advantageous in that its weight is lower.

Figure 5:
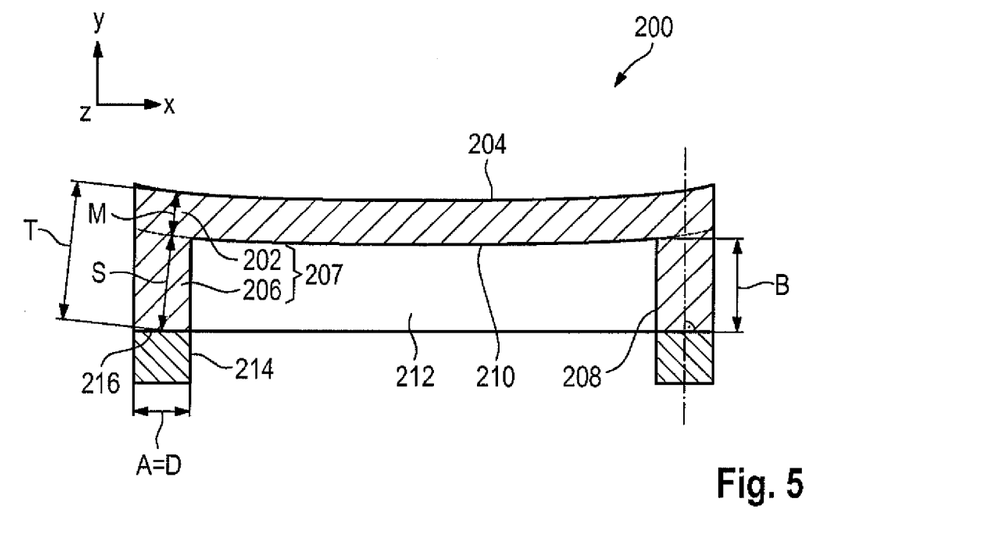
FIG. 5 is a schematic illustration of a mirror arrangement in accordance with a further embodiment.

In the mirror arrangements illustrated in FIGS. 3 and 4, the mounting elements 214 are attached to the side surfaces of the side wall 206. However, this is not a restriction and it is also possible to attach the mounting elements 214 on the end faces of the side wall 206. FIG. 5 is a schematic illustration of a mirror arrangement 200 in accordance with such an embodiment. The conditions S/D>0.5 and S/A>1 are also satisfied in this mirror arrangement 200, and so good deformation decoupling is provided. Moreover, the overall diameter of this mirror arrangement 200 including the mounting elements 214 is smaller than in the above-described embodiments on account of the connection from behind. This renders it possible to provide even larger mirror arrangements, without the evacuated interior of the lithography apparatus having to be widened. It should be noted that, in the mirror arrangement 200 in accordance with FIG. 5, the lateral extent A of the mounting elements equals the thickness D of the side wall (i.e. A=D). However, it is self-evident that it is possible to design the extent A of the mounting elements and the thickness D of the side wall to be different and to vary these depending on requirements. In a further variant, the mounting elements 214 can also be connected on the circumferential inner side of the side wall 206.

Figure 6:
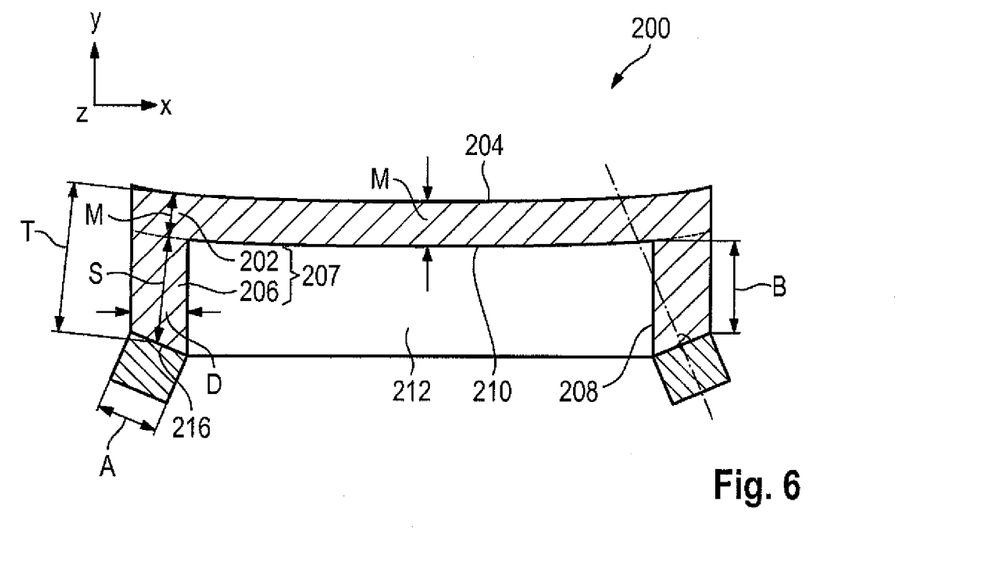
FIG. 6 is a schematic illustration of a mirror arrangement in accordance with a further embodiment.

FIG. 6 is a schematic illustration of a mirror arrangement 200 in accordance with a further embodiment. In this mirror arrangement 200, the mounting elements 214 are likewise attached to the end faces of the side wall 206, which have a beveled design, for example with an angle of approximately 30°. The conditions S/D>0.5 and S/A>1 are also satisfied in this arrangement, and so good deformation decoupling is provided. Moreover, at least some of the normals on the connection surfaces 216 extend through the cavity 212, which, as explained above, contributes to the deformation decoupling.

Figure 7:
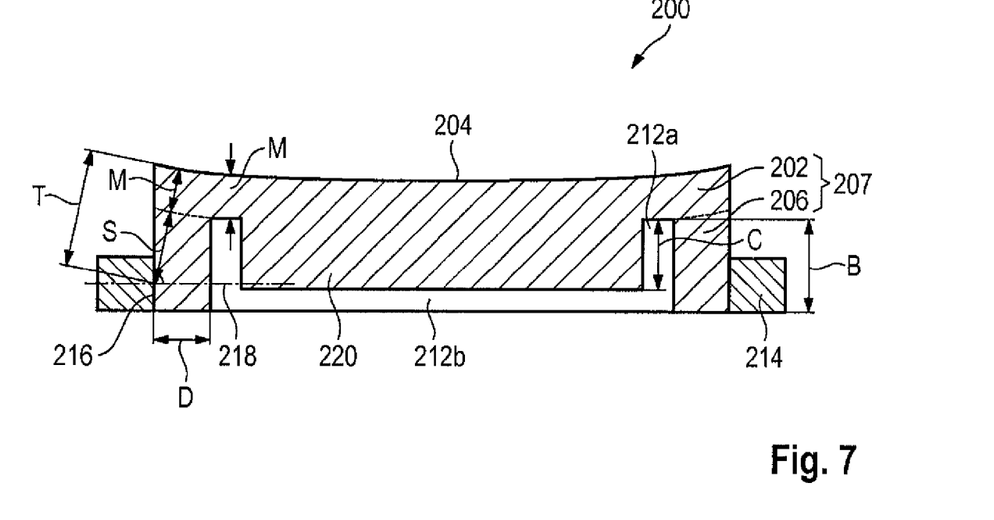
FIG. 7 is a schematic illustration of a mirror arrangement in accordance with a further embodiment.

FIG. 7 is a schematic illustration of a mirror arrangement 200 in accordance with a further embodiment. The mirror arrangement 200 shown in FIG. 7 differs from the mirror arrangement 200 in FIG. 3 by virtue of the fact that the mirror has not been completely hollowed out. Rather, an elevation, which extends into the cavity 212, is provided on the rear side of the mirror substrate 202. Hence the cavity 212 comprises an annular groove 212a and a disk-shaped cavity section 212b. The annular groove 212a is delimited by the inner side of the side wall 206, the rear side of the mirror substrate 202 and the outer side of the elevation 220. The depth C of the annular groove 212a corresponds to the height of the elevation 220. For the depth C of the annular groove 212a, 0<C≥B is expedient, for example C=10% . . . 80%−B. Although a depth C>B is theoretically possible, it is only expedient under specific circumstances in view of the mirror mass and the deformation decoupling. By way of example, the width of the annular groove 212a can be 0.5 to 3 cm.

Using the mirror arrangement 200 shown in FIG. 7, it is possible to achieve substantially the same deformation decoupling as when using the mirror arrangement 200 shown in FIG. 3, with, however, the mirror arrangement 200 shown in FIG. 7 having greater mirror rigidity. Here, the mirror rigidity can be adjusted by varying the height C of the elevation 220.

The connection surfaces 216 are also situated behind the mirror substrate 202 in this embodiment. Hence, it also applies in this embodiment that a normal arranged at any point on the connection surfaces 216 extends through the cavity 212, namely through the annular groove 212a or the cavity section 212b. As explained above, this contributes to the deformation decoupling.

The annular side wall 206 improves the deformation decoupling, but, overall, leads to a reduced rigidity of the mirror arrangement 200 when compared to a solid mirror arrangement. In order to increase the rigidity of the mirror arrangement 200, a cover can be provided on the rear side of the side wall 206. Such a mirror arrangement 200 is illustrated in FIG. 8.

Figure 8:
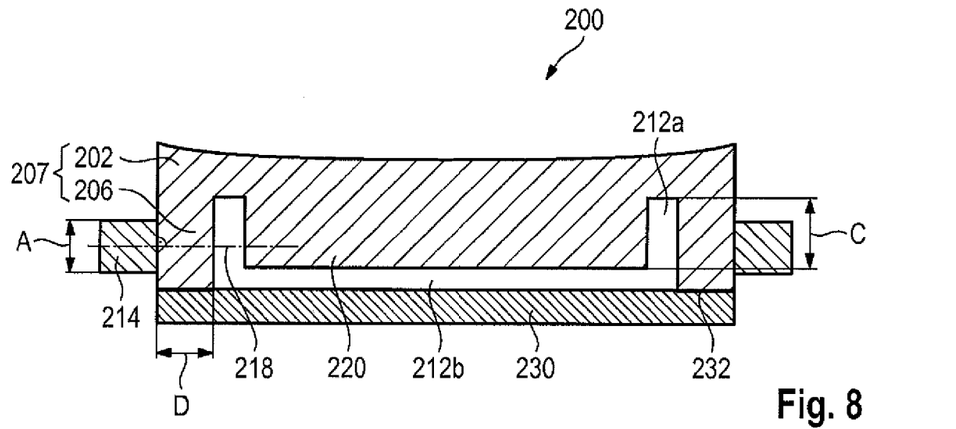
FIG. 8 is a schematic illustration of a mirror arrangement in accordance with a further embodiment.

In the mirror arrangement 200 illustrated in FIG. 8, the cavity 212 is closed by a disk-shaped cap 230. The cap 230 serves as cover element, which covers the cavity 212. Hence the cavity 212 is delimited in all (positive and negative) six spatial directions. The cap 230 should substantially have the same coefficient of thermal expansion as the mirror substrate 202 and the side wall 206. By way of example, the cap 230 can have a thickness of 0.5 cm to 10 cm. The thickness of the cap 230 need not necessarily be constant. However, the rigidity thereof should correspond to at least that of the mirror substrate 202. It is advantageous, if the cap 230 consists of the same material as the mirror body 207 made of the mirror substrate 202 and the side wall 206 because then the coefficient of thermal expansion thereof is also identical to that of the mirror body 207. By way of example, the cap 230 can be adhesively bonded or soldered onto the top end of the side wall 206, or be anodically bonded to the top end of the side wall 206.

Using the mirror arrangement 200 illustrated in FIG. 8, it is possible to achieve a comparatively high rigidity with reduced mass and good deformation decoupling. The deformations of the connection surface 232 between cap 230 and side wall are decoupled from the mirror substrate 202 by the annular side wall 206 such that its effect on the mirror substrate 202 is smaller than that of the connection surfaces 216.

In the mirror arrangement 200 in FIG. 8, the thickness D of the side wall 206 should not be selected to be too small, because otherwise there is a risk of relatively low natural frequencies. By way of example, the thickness D of the side wall 206 can be approximately 0.5 to 5 cm. Advantageous dimensions in respect of natural oscillations are given if A, C and D do not deviate from one another by a more than ±20%, advantageously ±5% or even only ±1%, i.e. if A=C=D substantially applies.

In this embodiment, the connection surfaces 216 are also situated behind the mirror substrate 202. Hence, it also applies to this embodiment that a normal arranged at any point on the connection surfaces 216 extends through the cavity 212, namely through the annular groove 212a or the cavity section 212b. As explained above, this contributes to the deformation decoupling. However, in contrast to the embodiments in accordance with FIG. 3, the mounting elements 214 are provided at a distance from the rear end of the side wall 206 in this case.

Figure 9:
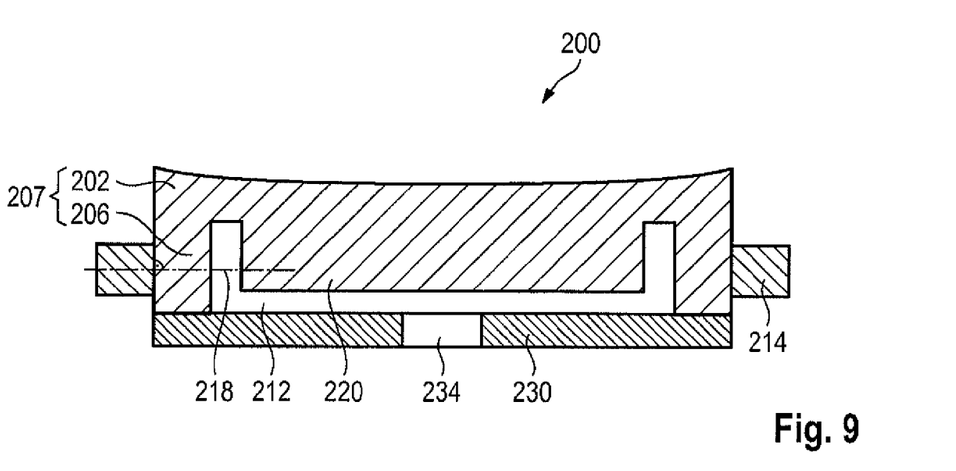
FIG. 9 is a schematic illustration of a mirror arrangement in accordance with a further embodiment.

FIG. 9 is a schematic illustration of a mirror arrangement 200 in accordance with a further embodiment. The embodiment of the mirror arrangement 200 illustrated in FIG. 9 is a variant of the embodiment illustrated in FIG. 8 and merely differs from the latter in that the cap 230 is provided with a through hole 234, which can, for example, be arranged in the center of the cap 230 and can, in particular, be circular. Hence pressure equalization is ensured between the cavity 212 and the surroundings of the mirror. It is advantageous if the inner diameter of the through hole 234 is no more than half of the mirror diameter because this can ensure good deformation decoupling in the case of high rigidity.

Figure 10:
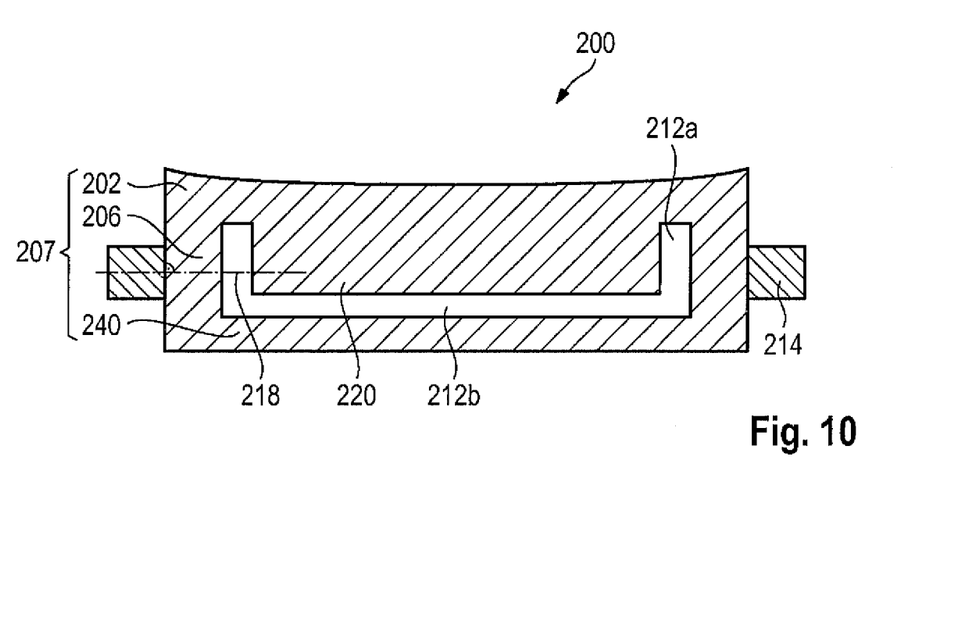
FIG. 10 is a schematic illustration of a mirror arrangement in accordance with a further embodiment.

FIG. 10 is a schematic illustration of a mirror arrangement 200 in accordance with a further embodiment. In accordance with this embodiment, the mirror arrangement 200 has the same weight distribution as the mirror arrangement 200 in FIG. 8 and hence it also has the same mirror dynamics. However, the mirror arrangement 200 in FIG. 10 is monolithic. That is to say that a disk-shaped rear wall 240 is provided at the rear end of the side wall 206 and the mirror substrate 202, the side wall 206 and the rear wall 240 form the mirror body 207 in an integral fashion. The cavity 212 is delimited by the inner sides of the side wall 206, the rear side of the mirror substrate 202, the outer side of the elevation 220 and the inner side of the rear wall 240. The cavity 212 is also subdivided into an annular groove 212a and a disk-shaped cavity section 212b in this case. Here, the rear wall 240 serves as cover element, which covers the cavity 212.

Fewer connections are provided in the mirror arrangement 200 in accordance with FIG. 10 than, for example, in the mirror arrangement 200 in accordance with FIG. 8. In other words, the rear wall 240 covering the cavity 212 can be provided without further connections. Hence the mirror arrangement 200 is exposed to fewer local stresses, which are created when providing such connections.

The monolithic mirror body 207, illustrated in FIG. 10, made of mirror substrate 202, side wall 206 and rear wall 240 can be produced as follows: initially, the mirror substrate 202, the side wall 206 and the rear wall 214 are provided as separate elements. Then, the side wall 206 (and optionally the elevation 220) is placed on the rear side of the mirror substrate 202 and the rear wall 240 is placed on the end of the side wall 206.

Alternatively, the mirror body can also consist of two parts, of which at least one part contains a recess on the contact surface. Hence, the monolithic mirror body 207 with the cavity 212 can be produced by heating and fusing these elements to one another.

Figure 11:
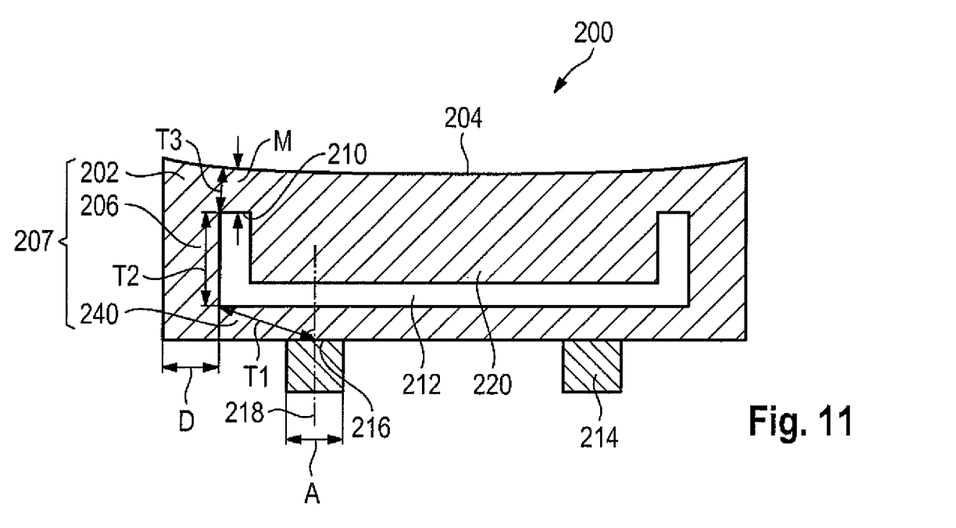
FIG. 11 is a schematic illustration of a mirror arrangement in accordance with a further embodiment.

FIG. 11 is a schematic illustration of a mirror arrangement 200 in accordance with a further embodiment. The mirror body 207 is also monolithic in this embodiment;

however, the mounting elements 214 are not connected to the side wall 206 or the circumference of the mirror arrangement 200, but rather to the rear side of the mirror arrangement 200, more precisely to the rear side of the rear wall 240. By way of example, mounting elements 214 may be attached at suitable locations, e.g. centrally, on the rear wall.

The mirror arrangement 200 shown in FIG. 11 is advantageous in that the spatial requirements are even smaller than in the case of connecting the mounting elements 214 on the side wall 206. This renders it possible to provide even larger mirror arrangements, without the evacuated interior of the lithography apparatus having to be widened. Furthermore, the provision of the cavity 212 between the rear wall 240, on the rear side of which the mounting elements are provided, and the mirror substrate 202 or the elevation 220 provided thereon enables a decoupling of deformations, which, as described above, can, for example, be created when connecting the mounting elements 214. In other words, it also applies to this embodiment that a normal on any point of the connection surface extends through the cavity 212. The mounting elements 214 should be distanced from the edge of the rear wall 240 by an absolute value which corresponds to at least the thickness D of the side wall 206. A distance of at least D plus the thickness of the rear wall is advantageous. Furthermore, the mirror arrangement 200 shown in FIG. 11 also ensures a high rigidity.

Furthermore, precisely one cavity 212 is formed between the mirror substrate 202, the side wall 206 and the cap 230. As a result, it is possible to achieve a better deformation decoupling compared to conventional arrangements, in which a multiplicity of cavities (e.g. as a result of honeycomb structures or the like) are provided between the mirror substrate and the rearward wall.

By contrast, if the mounting elements were to be provided directly on the rear side of a mirror substrate without a cavity, the deformations created during e.g. the connection of the mounting elements would have a direct effect on the geometry of the mirror surface and hence impair the optical properties of the mirror.

Furthermore, in the arrangements shown in FIGS. 3 to 10, the shortest path T from the connection surface 216 to the front side of the mirror substrate 202 is always a single straight path. However, this need not necessarily be the case and FIG. 11 shows an example of a case where this shortest path T through the mirror material does not consist of a single straight path but rather of three individual paths T1, T2 and T3. The first path T1 extends from the centroid of the connection surface 216 to the point at which the rear wall 240 meets the side wall 206. The second path T2 extends from this point to the joining site of side wall 206 and mirror substrate 202. The third path T3 then extends further to the front side 204 of the mirror substrate 202. The length of the overall path is T=T1+T2+T3. In the case of a planar mirror surface 204, T2 and T3 could be combined and T would consist of only two path sections T1 and T2. The length of the overall path would in this case be T=T1+T2. In the case of this length T, the condition (T−M)/D=S/D>0.5 and S/A>1 is also satisfied, and so good deformation decoupling is provided.

Figure 12:
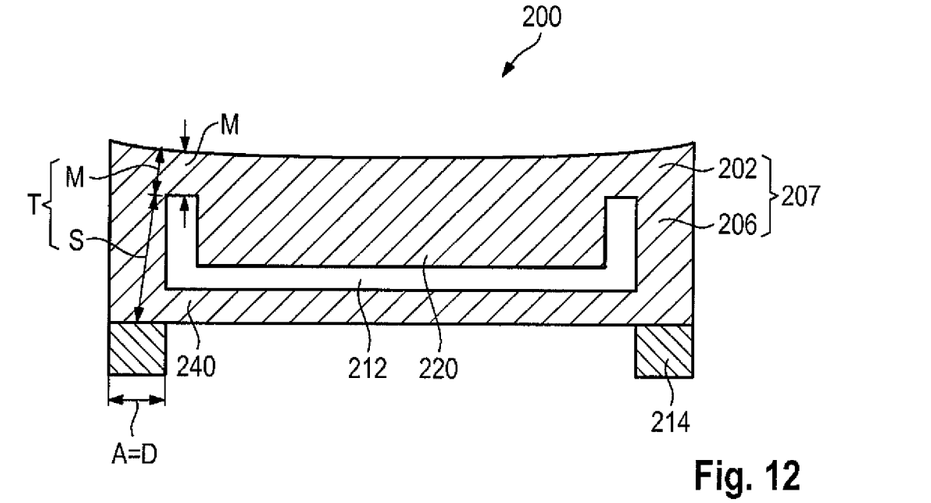
FIG. 12 is a schematic illustration of a mirror arrangement in accordance with a further embodiment.

FIG. 12 is a schematic illustration of a mirror arrangement 200 in accordance with a further embodiment. In this embodiment, the mounting elements 214 are provided on the outer edge of the rear wall 240. In this case, the length S also satisfies the conditions S/D>0.5 and S/A>1, and so good deformation decoupling is provided.

Figure 13:
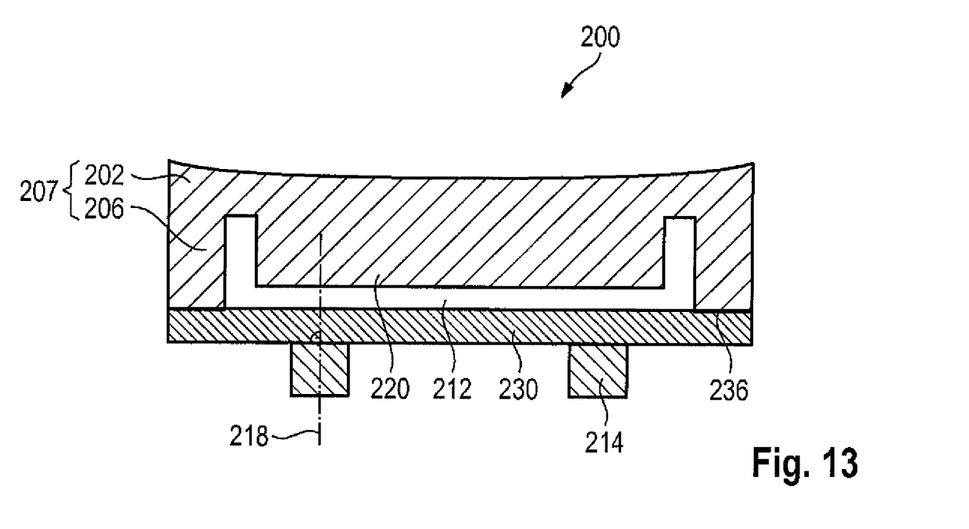
FIG. 13 is a schematic illustration of a mirror arrangement in accordance with a further embodiment.

In accordance with a further embodiment, the mounting elements 214 can also be connected on the rear side of a non-monolithic mirror arrangement. Such a mirror arrangement 200 is illustrated in FIG. 13. In the mirror arrangement 200 in accordance with FIG. 13, the rear wall 230 is provided separately from the mirror body 207 made of mirror substrate 202 and side wall 206, and is connected thereto, as described above, by anodic bonding or the like. The mounting elements 214 are connected to the rear wall 230 on the rear side thereof. Hence the advantages described for FIG. 11 apply.

The mirror arrangement 200 in accordance with FIG. 13 can be produced via a production method which renders it possible to compensate the deformations which were created when connecting the mounting elements 214. Such a method is illustrated schematically in FIG. 14.

Figure 14:
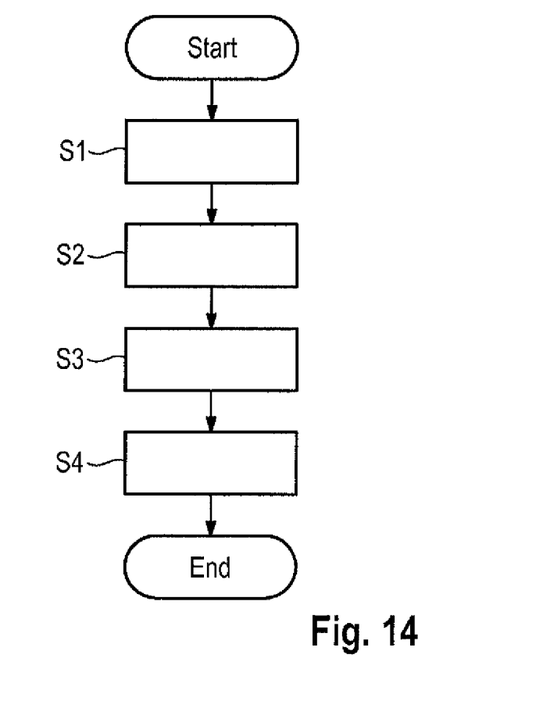
FIG. 14 is a schematic illustration of a method for producing the mirror arrangement illustrated in FIG. 13.

At the start of this method, the cap 230 and the mirror body 207 made of mirror substrate 202 and side wall 206 are not yet attached to one another. In step S1, the mounting elements 214 are initially attached to a flat side (namely the rear side) of the side wall, for example adhesively bonded or soldered. Here, there can be deformations of the cap 230 as a result of shrinkage at the connection surface, as described above. In step S2, these deformations or the geometry of at least one edge region of the cap 230 are detected. By way of example, this can be brought about by an interferometric measurement. In the following step S3, an annular edge region 236 of the cap 230 is processed in order to compensate for the detected deformations or to adapt the latter to the topography of the end face of the side wall. This annular edge region 236 comprises at least the region of the connection surface 232 where the cap 230 is subsequently connected to the side wall 206. Hence, the edge region 236 lies on the opposite side of the rear side of the cap 230, on which the mounting elements 214 are attached. By way of example, the cap can be polished in this annular edge region 236. After the deformations in the edge region 236 were corrected, the cap 230 is connected to the mirror body 207 in the step S4. More precisely, the annular edge region 236 is connected to the top end (or the end) of the side wall 206. By way of example, the cap 230 can be attached to the side wall 206 by anodic bonding or the like.

Using this production method, it is possible to compensate for the deformations created during the connection of the mounting elements 214 such that it is possible to achieve a mirror arrangement 200 with even more precise dimensions. This mirror arrangement 200 can be mounted on a frame element in the lithography apparatus 100 with the aid of the mounting elements 214.

The above-described method can be varied in a suitable manner. By way of example, the step S2 for detecting the deformations is not mandatory. Thus, it is also possible to attach the mounting elements 214 to a cap 230 whose geometry is not yet precisely adapted to the geometry of the side wall 206 and carry out the precise adaptation of the geometries to one another only after attaching the mounting elements 214, optionally with the aid of optical detection. Furthermore, the steps S2 (detecting the geometry of the cap 230) and S3 (processing the connection region) can also be carried out iteratively, i.e. a number of times in succession.

It should be noted that the above-described embodiments are merely exemplary and can be varied in many different ways within the scope of protection of the patent claims. In particular, the features of the above-described embodiments can also be combined with each other.

Figure 15:
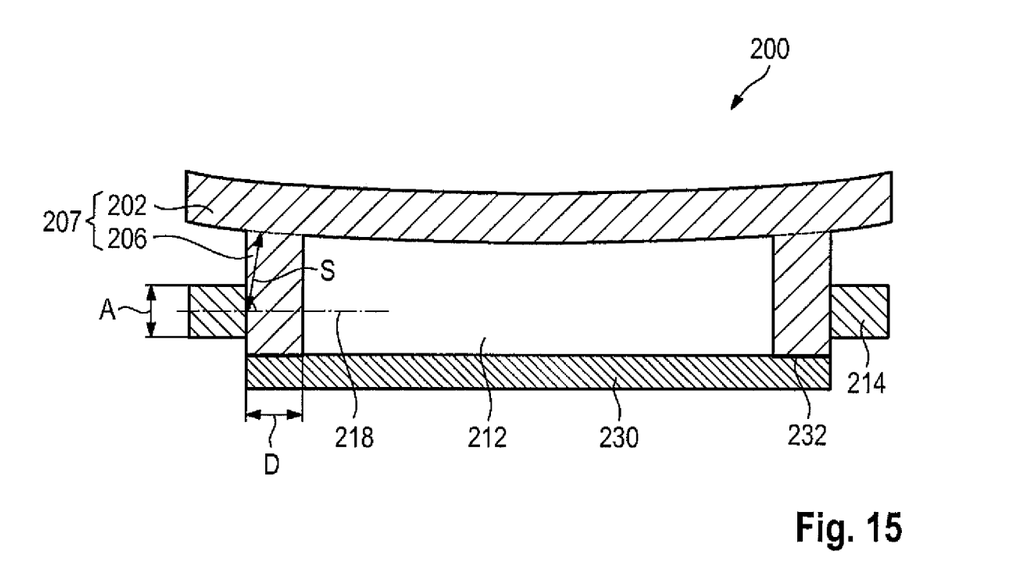
FIG. 15 is a schematic illustration of a mirror arrangement in accordance with a further embodiment.

By way of example, the side wall 206 need not necessarily be provided on the edge of the mirror substrate 202, but can also be arranged offset inward at a distance from the edge. FIG. 15 is a schematic illustration of such a mirror arrangement 200. In this mirror arrangement 200, the mirror substrate 202 projects beyond the side wall 206. In this case, the annular side wall 206 is also arranged along the circumference of the mirror substrate 202. In a possible embodiment, the distance between the side wall and the edge is constant such that the side wall 206 extends parallel to the edge of the mirror substrate. However, there is no restriction to this, and it is also possible for the distance between the side wall 206 and the edge to vary along the circumference. By way of example, it is possible for the mirror substrate 202 to be kidney-shaped and for the side wall 206 to be circular or elliptical. In the process, it is also possible, in view of the dynamic properties of the mirror body 207, that the variation of the distance between the side wall 206 and the edge of the mirror substrate 202 does not to exceed a predetermined maximum value. In the case of a circular mirror substrate 202, for example, this maximum value may be no more than 30%, no more than 15% or even no more than 5% of the diameter of the mirror substrate 202. In the case of an elliptical, oval or kidney-shaped shape of the mirror substrate 202, the mirror substrate 202 is characterized by two characteristic variables, for example by the diameter through the major semi-axes and the diameter through the minor semi-axis in the case of an elliptical shape. Thus, for example, the aforementioned maximum value may be no more than 30%, no more than 15% or even no more than 5% of the larger one of these two characteristic variables, that is to say, for example, the diameter through the major semi-axes of the mirror substrate 202. Alternatively, or in addition thereto, the aforementioned maximum value may be no more than half the difference between these two characteristic variables.

Hence it is possible to achieve a larger mirror surface with less weight. Moreover, no elevation on the rear side of the mirror substrate 202 is provided in this mirror arrangement 200. The mirror substrate 202 substantially has the same thickness along the mirror surface between the side walls 206. The temperature distribution in the mirror substrate 202 depends on the depth to which the radiation heat absorbed by the mirror penetrates. Since the thickness of the mirror substrate 202 is substantially constant along the mirror surface, it is therefore possible to achieve a uniform temperature profile along the surface of the mirror. The statements made above apply to the ratios between the length S, the thickness D of the mirror wall and the height A of the mounting elements 214.

Moreover, in the exemplary embodiments illustrated above, the mirror body 207 is connected with the aid of mounting elements 214, which are attached to planar connection surfaces on the outer side of the side wall 206. However, the invention is not restricted to this, and it is also possible to provide a recess in the side wall, into which a connection element which is connected to the mounting element is fitted. Examples for such an arrangement are disclosed in WO 2005/106557 A1; see, in particular, FIGS. 4-8 therein. In this case, the connection surface is substantially cylindrical and can extend along the inner edge of the recess, wherein the centroid lies on the cylinder axis. In this case too, it is possible to achieve better deformation decoupling if the aforementioned condition S/D<0.5 is achieved.

Furthermore, various embodiments for mirror arrangements were explained on the basis of the mirror arrangement 200 of the lithography apparatus 100. However, it is self-evident that the illustrated embodiments can also be applied to any other mirror in the lithography apparatus 100.

Furthermore, exemplary embodiments were explained for a mirror arrangement in an EUV lithography apparatus. However, the invention is not restricted to EUV lithography apparatuses, but rather can also be applied to other lithography apparatuses.

LIST OF REFERENCE SIGNS

10 Mirror arrangement
12 Mirror substrate
14 Bulges
16 Mounting elements
100 EUV lithography apparatus
102 Beam shaping system
104 Illumination system
106 Projection system
108 EUV light source
110 Collimator
112 Monochromator
114 EUV radiation
116 First mirror
118 Second mirror
120 Photomask
122 Wafer
124 Third mirror 200 Fourth mirror, mirror arrangement
202 Mirror substrate
204 Reflecting coating
206 Side wall
207 Mirror body
208 Inner side
210 Rear side
212 Cavity
214 Mounting elements
216 Connection surfaces
218 Normals
220 Elevation
230 Cap
232 Connection surface
234 Through hole
236 Annular edge region
240 Rear wall

The invention claimed is:

1. An apparatus, comprising:
a mirror arrangement, comprising:
   a mirror substrate having a front side comprising a reflecting surface; and
   a side wall extending along a circumference of the mirror substrate from a rear side of the mirror substrate, the side wall and the mirror substrate defining a cavity; and
mounting elements configured to mount the mirror arrangement to a structural element of a lithography apparatus,
wherein:
   for each mounting element, the mounting element is connected to the mirror arrangement at a connection surface; and
   S/D>0.5 at a connection surface, where D is a thickness of the side wall at the connection surface, S is equal to T−M, T is a length of a shortest path through the mirror material from a centroid of the connection surface to the front side of the mirror substrate, and M is a thickness of the mirror substrate.

2. The apparatus of claim 1, wherein S is the length of the shortest path through the mirror material from the centroid of the connection surface to the rear side of the mirror substrate.

3. The apparatus of claim 1, wherein S/D>1.

4. The apparatus of claim 1, wherein S/A>1 where A is an extent of the connection surface on the side wall.

5. The apparatus of claim 1, wherein S/A>1.5 where A is an extent of the connection surface on the side wall.

6. The apparatus of claim 1, wherein the connection surfaces of the mounting elements are on an outer side of the side wall, or the connection surfaces of the mounting elements are on an inner side of the side wall.

7. The apparatus of claim 1, wherein the cavity has an opening at the rear side of the mirror arrangement.

8. The apparatus of claim 1, wherein the cavity is closed.

9. The apparatus of claim 1, further comprising a cover element joined to the side wall so that the mirror substrate, the side wall and the cover element define the cavity.

10. The apparatus of claim 9, wherein the cover element has an opening.

11. The apparatus of claim 10, wherein an internal diameter of the opening of the cover element is less than half a diameter of the mirror substrate.

12. The apparatus of claim 1, wherein an extent of the connection surface in a direction of an optical axis of the mirror arrangement is less than a depth of the cavity.

13. The apparatus of claim 1, wherein an elevation is a distance from an edge of the rear side of the mirror substrate, and an annular groove is between the side wall and the elevation.

14. The apparatus of claim 13, wherein a height of the elevation is from 0.1 to 0.8 times a depth of the cavity.

15. The apparatus of claim 14, wherein an extent of the connection surface in a direction of the optical axis of the mirror arrangement, a height of the elevation and D are substantially equal.

16. The apparatus of claim 1, wherein the side wall is integral with the mirror substrate.

17. The apparatus of claim 1, further comprising a cover element joined to the side wall so that the mirror substrate, wherein:
   the side wall and the cover element define the cavity; and
   the mirror substrate, the side wall and the cover element are integral.

18. The apparatus of claim 1, wherein the side wall is annular.

19. A lithography apparatus, comprising:
a structural element; and
the apparatus of claim 1,
wherein the mounting elements mount the mirror arrangement to the structural element.

20. The lithography apparatus of claim 19, wherein the lithography apparatus is an EUV lithography apparatus.

21. An apparatus, comprising:
a mirror arrangement, comprising:
   a mirror substrate having a front side comprising a reflecting surface; and a side wall extending along a circumference of the mirror substrate from a rear side of the mirror substrate, the side wall and mirror substrate defining a cavity; and mounting elements configured to mount the mirror arrangement to a structural element of the lithography apparatus, wherein:
for each mounting element, the mounting element is connected to the minor arrangement at a connection surface; and normals on the connection surface extend through the cavity, and wherein an entire surface area of the rear side of the mirror substrate is exposed in a region inside of the side wall.

22. A lithography apparatus, comprising:
a structural element; and
the apparatus of claim 21,
wherein the mounting elements mount the mirror arrangement to the structural element.

23. The lithography apparatus of claim 22, wherein the lithography apparatus is an EUV lithography apparatus.

24. The apparatus of claim 1, wherein an entire area of the rear side of the mirror substrate is unsupported in a region inside of the side wall.

25. The apparatus of claim 1, wherein an entire surface area of the rear side of the mirror substrate is exposed in a region inside of the side wall.

26. The apparatus of claim 21, wherein an entire area of the rear side of the mirror substrate is unsupported in a region inside of the side wall.

* * * * *

UNITED STATES PATENT AND TRADEMARK OFFICE
CERTIFICATE OF CORRECTION

PATENT NO. : 9,459,538 B2
APPLICATION NO. : 14/534644
DATED : October 4, 2016
INVENTOR(S) : Dirk Schaffer, Wilfried Clauss and Hin-Yiu Anthony Chung

Page 1 of 1

It is certified that error appears in the above-identified patent and that said Letters Patent is hereby corrected as shown below:

In the Claims

Column 18, Line 42, Claim 21, delete "minor" and insert -- mirror --.

Signed and Sealed this
Seventh Day of February, 2017

Michelle K. Lee
*Director of the United States Patent and Trademark Office*